United States Patent [19]

Coleman, Jr.

[11] Patent Number: 5,561,427
[45] Date of Patent: Oct. 1, 1996

[54] ANALOG TO DIGITAL CONVERTER WITH CONTINUOUS CONVERSION CYCLES AND LARGE INPUT SIGNAL RANGE

[75] Inventor: Edward P. Coleman, Jr., Fairport, N.Y.

[73] Assignee: PSC Inc., Webster, N.Y.

[21] Appl. No.: 366,565

[22] Filed: Dec. 30, 1994

[51] Int. Cl.$^6$ .............................. H03M 1/38; H03M 1/18
[52] U.S. Cl. ........................................... 341/161; 341/139
[58] Field of Search ..................................... 341/139, 161, 341/164, 165, 155

[56] References Cited

U.S. PATENT DOCUMENTS

| | | | |
|---|---|---|---|
| 4,593,270 | 6/1986 | White | 340/347 AD |
| 4,771,266 | 9/1988 | Nunokawa | 341/161 R |
| 4,777,470 | 10/1988 | Naylor et al. | 341/163 |
| 4,940,981 | 7/1990 | Naylor et al. | 341/161 |
| 4,989,004 | 1/1991 | Kanayama | 341/161 |
| 4,999,628 | 3/1991 | Kakubo et al. | 341/139 |
| 5,377,248 | 12/1994 | Brooks | 377/70 |

*Primary Examiner*—Jeffrey A. Gaffin
*Assistant Examiner*—Jason L. W. Kost
*Attorney, Agent, or Firm*—Joseph F. Murphy

[57] ABSTRACT

A successive approximation A/D having dual comparators for allowing a larger range of analog input signals to be converted into digital form. One comparator is an N-channel device, and the other comparator is a P-channel device. The A/D switches to either the N-channel device or the P-channel device based upon whether the first two comparisons determine the most-significant bit and the next-most significant bit are a "11", in which the N-channel device is selected, or anything else, in which the P-channel device is selected. Switching circuitry is included to output the proper comparator based on these two comparisons.

Control circuitry is also provided to allow for successive conversions using only a single address read. A one-half clock cycle reset occurs at the start of every MSB comparison for every n-bit read, and this reset goes to every component in the A/D except the latch for the LSB, which must be held for at least one more clock cycle before since it has not yet been output to the data bus as yet. Gate circuitry is also added to the input of the D/A portion of the A/D, in which the LSB is not allowed to be input to the D/A until after the MSB comparison has been performed for the next n-bit read.

15 Claims, 7 Drawing Sheets

ANALOG TO DIGITAL CONVERTER WITH CONTINUOUS CONVERSION CYCLES AND LARGE INPUT SIGNAL RANGE

BACKGROUND OF THE INVENTION

1. Field of the Invention

This invention relates to a successive approximation analog to digital converter that has a large input range and that is capable of continuous conversion cycles without the need to reset the selection and control logic of the converter.

2. Description of the Related Art

Figure 1:
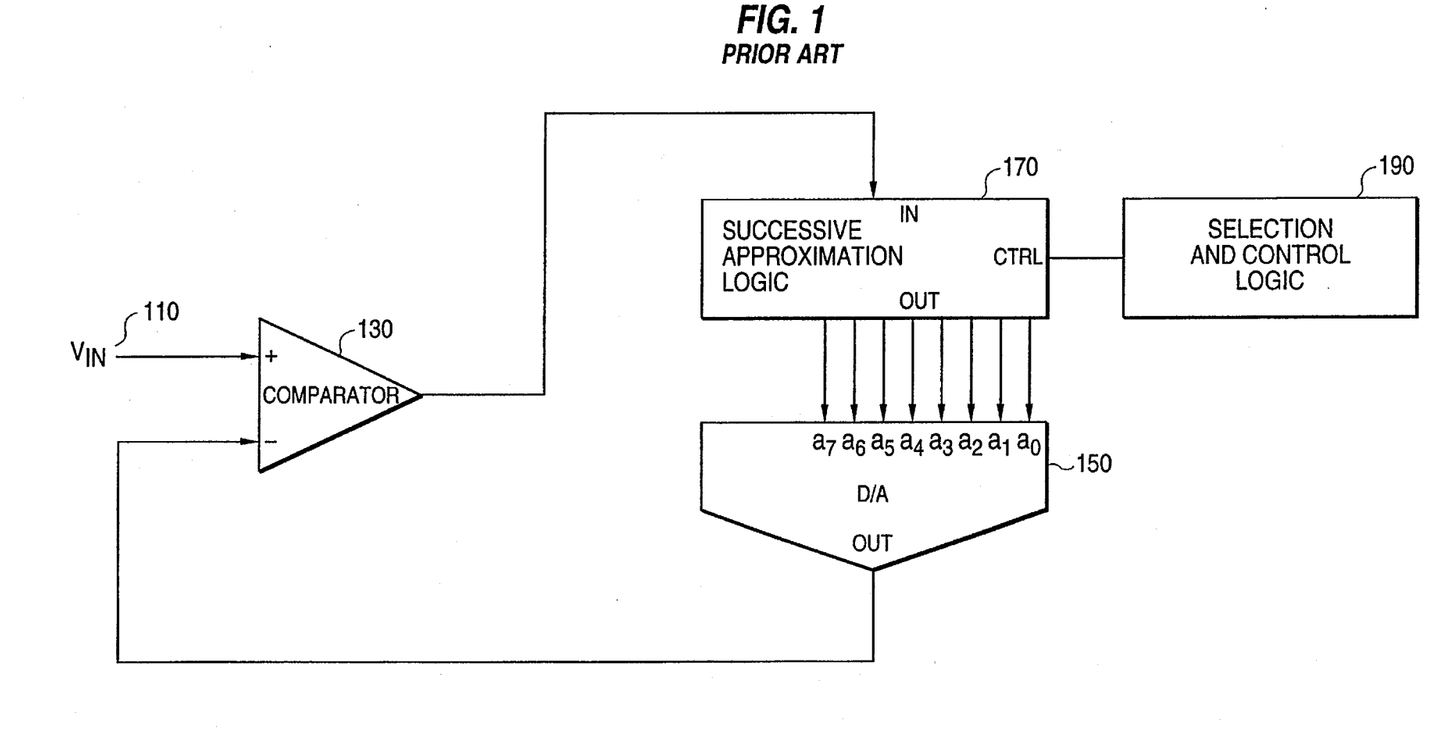
FIG. 1 is a block diagram of a conventional successive approximation A/D converter.

Successive approximation analog-to-digital converters (A/D) are well known in the art. A conventional successive approximation analog to digital converter is shown in FIG. 1. In this FIG., an analog voltage $V_{in}$ 110 is supplied to one input port of a comparator 130. The other input of the comparator 130 receives an output signal from a digital-to-analog converter (D/A) 150. At the start of the most significant bit (MSB) comparison, the digital-to-analog converter 150 receives a digital input value equal to one-half the maximum digital value that it can accept from the successive approximation logic 170 under control of the selection and control logic 190. For example, with an eight-bit D/A, the initial input value to the D/A would then be 10000000 (=bits $a_7 a_6 a_5 a_4 a_3 a_2 a_1 a_0$).

Therefore, the analog voltage $V_{in}$ 110 is initially compared to an analog value output from the D/A 150 corresponding to the digital input of 10000000, which is approximately the analog mid-range voltage. If the analog voltage $V_{in}$ 110 is greater than this analog mid-range voltage, then the MSB of the D/A 150 is set to a "one" for the rest of the A/D conversion process. If the analog voltage $V_{in}$ 110 is less than this analog mid-range voltage as determined by the output of the comparator 130, then the MSB of the eight-bit digital input to the D/A 150 is set to a "zero" for the rest of the A/D conversion process.

The conversion process then proceeds to the next highest digital bit, which in this instance is the bit $a_6$. Bit $a_6$ is set to a "one" during the bit $a_6$ comparison, and $V_{in}$ 110 is compared to the D/A output due to a digital input of either 11000000 or 01000000, depending upon whether the MSB has been set to a "one" or a "zero" based on the MSB comparison just completed, as discussed previously. Based on the output of the comparator 130, the next-most MSB of the digital word (i.e., bit $a_6$) is thereby determined.

This process continues all the way down to the least significant bit $a_0$, and by this procedure, an eight-bit digital word can be obtained by successive approximation means in as little as eight clock cycles, not counting clock cycles required for addressing and selecting the A/D.

In conventional successive approximation A/Ds as shown in FIG. 1, one needs to reset the selection and control logic 190 for the A/D each time an n-bit conversion cycle commences, since the conventional A/D requires a leading address cycle prior to each read of the A/D. A conventional A/D requires multiple addressing to perform consecutive reads, resulting in an n-bit word needed to address and set up the A/D chip, and another n-bit word needed to retrieve the digital data from the A/D over the output data bus. For an eight bit A/D, this results in 16 clock cycles per each eight-bit read of the A/D.

In addition, the comparator 130 of the conventional A/D limits the allowable range of the input analog voltage $V_{in}$ 110 to within the allowable input voltage range of the comparator 130. This range may be less than the range desired for conversion purposes.

It is therefore desirable to have a successive approximation A/D that allows continuous conversion cycles without the need to reset the selection and control logic of the A/D, and to thereby allow any number of successive reads after a single address cycle.

It is also desirable to have a successive approximation A/D that allows a greater range of analog input signals to be converted to digital signals by the A/D.

SUMMARY OF THE INVENTION

It is an object of the invention to provide a wide input range for the A/D converter. It is also an object of the invention to provide an A/D that can perform continuous conversion cycles without the need to reset the internal selection and control logic of the A/D.

In accordance with these objects, there is provided according to the invention a successive approximation A/D converter for receiving an analog input signal and outputting an n-bit digital signal. The A/D according to the invention includes an input circuit for receiving the analog input signal, a digital-to-analog converter, which includes n input ports for receiving an n-bit digital word, and an output port for outputting an analog potential based on the n-bit digital word. In the A/D according to the invention, n is an integer greater than one, with bit n corresponding to a most significant bit and bit 0 corresponding to a least significant bit. The A/D according to the invention further includes a comparison circuit for comparing the analog input signal to the analog potential output from the digital-to-analog converter and outputting a comparison result. The A/D also includes a first reset circuit, which outputs a one-half clock cycle reset signal at a clock cycle immediately before the start of the most significant bit comparison for an n-bit conversion. A second reset circuit outputs a delayed reset signal at a clock cycle after the one-half clock cycle reset signal is output. An A/D according to the invention also has an n-bit counter that outputs a count signal indicative of which bit of the n-bit digital word is currently being compared by the comparison circuit. In this A/D, n latches each receive the comparison result from the comparison means at an input port and the count signal from the n-bit counter at an enable port, and output the comparison result at an output port on a next clock cycle. The n latches respectively correspond to the n bits of the n-bit digital word. The first n-1 of the latches receive the reset signal at a clear input, and the remaining one of the latches, which corresponds to said least significant bit, receives the delayed reset signal at a clear input. One of the n latches outputs the comparison result on an output data bus based on the count signal. The A/D comprises n gates respectively connected to the output port of the n latches and each receiving the count signal from the counter. The n gates output an n-bit gated signal to the n input ports of the digital-to-analog converter based on a logical result of the count signal and the comparison result.

BRIEF DESCRIPTION OF THE DRAWINGS

The features of the invention are set forth with particularity in the appended claims. The invention, together with further objects and advantages thereof, may best be understood by making reference to the following description taken in conjunction with the accompanying drawings, and wherein:

DETAILED DESCRIPTION OF THE PREFERRED EMBODIMENTS

Figure 2:
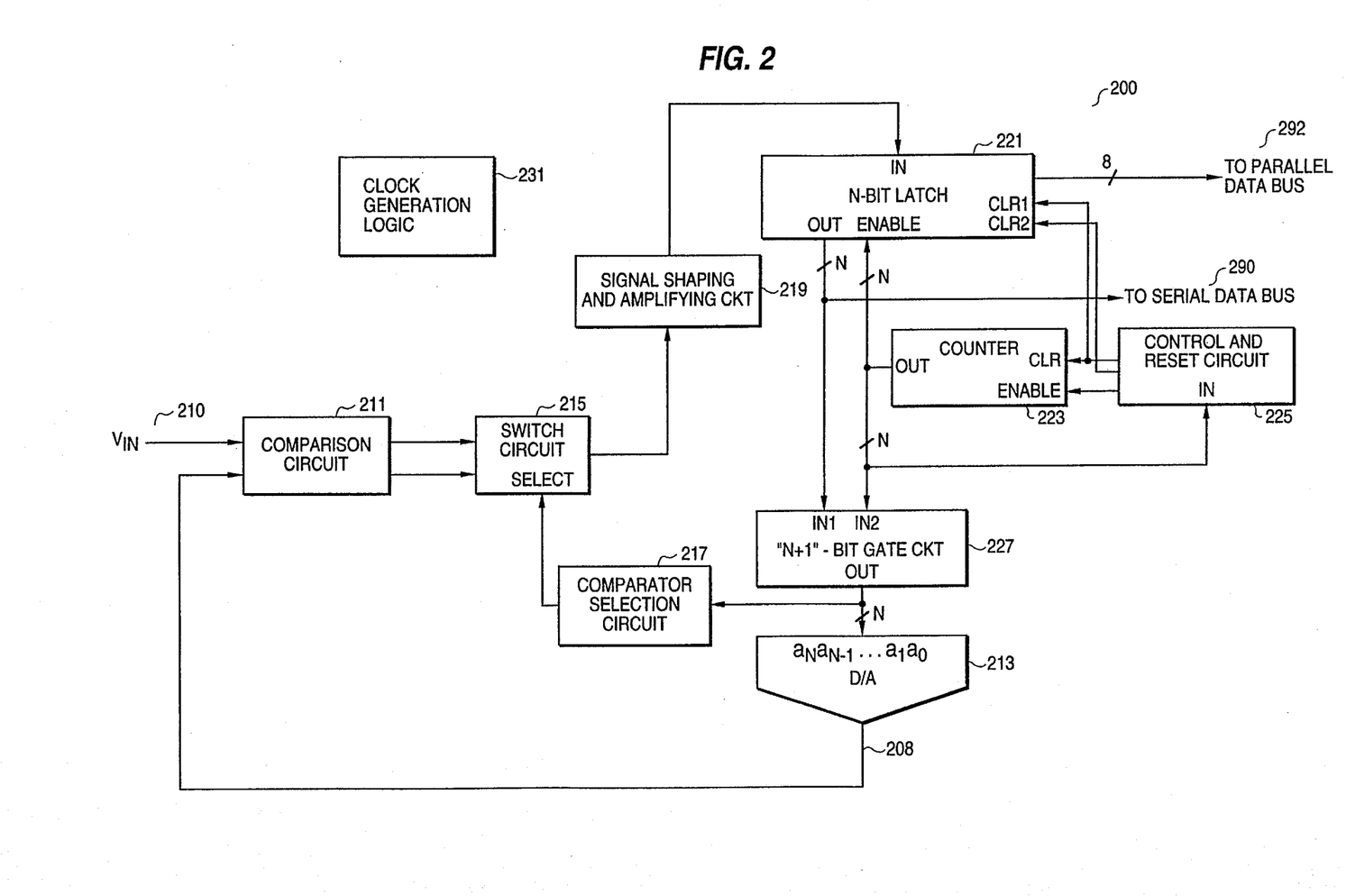
FIG. 2 is a high-level block diagram of a successive approximation A/D converter according to the invention.

Referring now to FIG. 2, a successive approximation analog-to-digital converter (A/D) 200 according to the preferred embodiment of the invention is shown, with both a serial output onto a serial data bus 290 and parallel output onto a parallel data bus 292. The A/D 200 according to the preferred embodiment requires only one leading address cycle to precede any number of successive reads, and has an input comparator structure that allows a greater range of analog input voltages to be converted by the A/D 200 than has been available using conventional A/Ds.

The A/D 200 has an input voltage Vin 210 input to one input of a comparison circuit 211. The comparison circuit 211 has a second input receiving an output 208 from the D/A converter 213. The output of the comparison circuit 211 goes to a switch circuit 215, which is under control of the n-bit digital input to the D/A 213 via the comparator selection circuit 217. The output of the switch circuit 215 goes to a signal shaping and amplification circuit 219, which outputs a signal to the input of an n-bit latch 221. The n-bit latch 221 is enabled by a counter 223. Both the n-bit latch 221 and the counter 223 are controlled by the control and reset logic 225. An (n+1)-bit gate circuit 227 receives inputs from the n-bit latch 221 and the counter 223, and allows data to be latched into the input of the D/A 213. The n-bit latch 221 outputs data onto a data bus 292, and the A/D 200 receives clock signals from clock generation logic 231. This structure will be described in greater detail by referring to FIG. 3.

Figure 3:
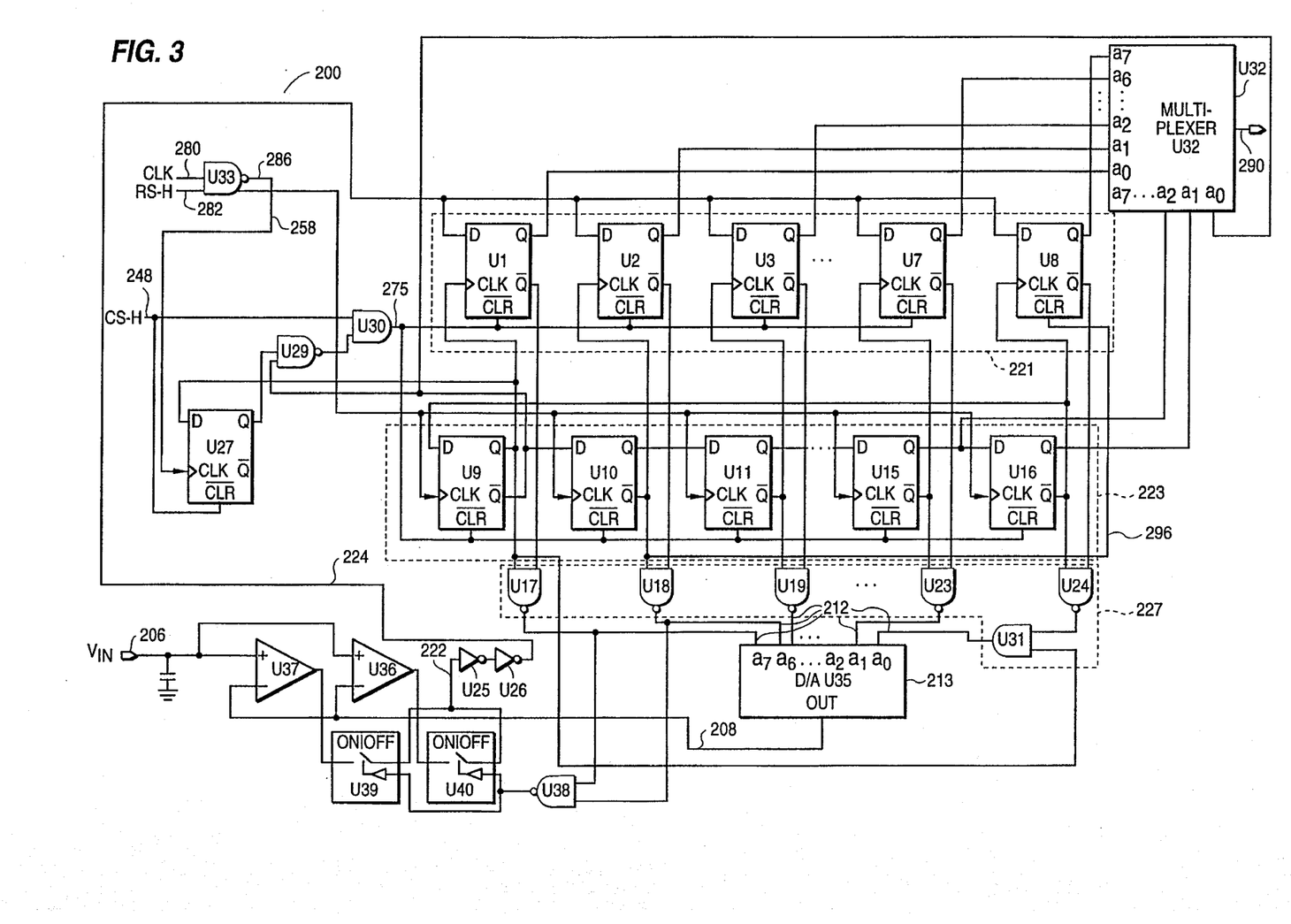
FIG. 3 is a detailed block diagram of a successive approximation A/D converter according to the preferred embodiment of the invention.

The A/D 200 according to the first embodiment, and as shown in FIG. 3, has two voltage comparators, U36 and U37. Comparators U36 and U37 both receive the input analog voltage $V_{in}$ 206, on a non-inverting input of the respective comparators U36, U37, and an output analog voltage 208 from the digital-to-analog converter (D/A) U35 on an inverting input of each of the respective comparators U36, U37.

The eight-bit A/D 200 according to the preferred embodiment is configured such that prior to the first conversion, a bit sequence of 10000000 is respectively set at the $a_7 a_6 a_5 a_4 a_3 a_2 a_1 a_0$ inputs 212 to the D/A U35, to thereby output a mid-range output analog voltage 208 from D/A U35 that is coupled to the inverting input of comparators U36, U37. On/Off Switch U40 and Off/On nswitch (Not-switch) U39 are respectively connected as shown in FIG. 3 to the outputs of comparators U36 and U37, such that only one of the comparators U36, U37 is connected to the input of inverter U25 at a time. Inverters U25 and U26 are used to amplify the output signal 222 from the comparators U36, U37, and the output 224 from inverter U26 is then sent to a bank of flip-flops U1 through U8, represented in the preferred embodiment as D-type flip-flops.

The decision of which of the two comparators U36, U37 performs the comparison is determined by NAND gate U38. NAND gate U38 receives as input the highest two significant bits $a_7$ and $a_6$ that are input to D/A U35. When both $a_7$ and $a_6$ are "one", then the NAND gate U38 outputs a logical "zero", which is sent to both the off/on n-switch U39 and the on/off switch U40. This logical "zero" value output from U38 acts to turn the on/off switch U40 "ON" and to turn the off/on n-switch U39 "OFF", which allows the output of comparator U36 through to the input of inverter U25.

When either $a_7$ or $a_6$ are "zero", then the NAND gate U38 outputs a logical "one", which is sent to both the off/on n-switch U39 and the on/off switch U40. This logical "one" value output from U38 acts to turn the on/off switch U40 "OFF" and to turn the off/on n-switch U39 "ON", which allows the output of comparator U37 through to the input of inverter U25.

At the start of the analog-to-digital conversion, which corresponds to the start of the MSB comparison, $a_7$ is at a "one" and $a_6$ is at a "zero", since NAND Gate U17 has a "01" at its two input ports and NAND Gates U18 through U24 have a "11" at their respective two input ports, and AND Gate U31 has a "00" at its two input ports after the Chip Select signal CS-H 248 has been asserted just prior to the MSB comparison. Therefore, NAND Gate U38 will output a "one" for the MSB comparison, which will switch on U40 and switch off U39.

If, during the comparison of the next-most significant bit $a_6$, it is determined that $V_{in}$ 206 is greater than three-fourths (¾) of the allowable input analog voltage range, then bits $a_7$ and $a_6$ will both be set to a "one" for the rest of the conversion process, and on/off switch U40 will be turned "ON" and off/on n-switch U39 will be turned "OFF".

In the preferred embodiment, the A/D 200 is designed to handle an input range of from 0 to 2.4 volts, which is twice the reference voltage of 1.2 volts. In this embodiment, if $V_{in}$ 206 is greater than ¾*2.4=1.8 volts, this will cause $a_7$ and $a_6$ to both be set to a "one" after the first and second conversion cycle of the eight-bit read, and thereby cause comparator U36 to be used for the last six comparisons of the eight-bit digital word to be determined by successive approximation means. If $V_{in}$ 206 is less than 1.8 volts, that will cause either $a_7$ or $a_6$ (or both) to be set to a "one" for the entire eight conversion cycles, and thereby cause comparator U37 to be used for the each of eight comparisons of the eight bit digital word to be determined by successive approximation means. Note that the above discussion applies equally as well to an n-bit A/D converter, in which there are n conversion cycles for each n-bit read.

In the preferred embodiment, comparator U37 is an N-channel device, and comparator U36 is a P-channel device. This means that the differential input pair of transistors used in U37 (not shown) are N-channel transistors (FETs or BJTs, or the like), while the differential input pair of transistors used in U36 (not shown) are P-channel transistors. With a high analog input signal $V_{in}$ 206 (i.e., greater than 1.8 volts), the invention according to the first embodiment chooses the N-channel comparator U37 to output the comparison signal 222, since this device is better at handling such high input signals than the P-channel comparator U36. The N-channel comparator U37 can easily compare an analog input signal $V_{in}$ 206 up to the supply rail voltage $V_{dd}$ 250, which in the preferred embodiment is set to 2.4 volts, but may be a higher or lower value (i.e., 3.2 volts), depending upon the analog range and precision desired.

The P-channel comparator U36 is better at comparing a low analog input signal $V_{in}$ 206 than the N-channel comparator U37. Thus, the A/D 200 according to the preferred embodiment is designed so that U36 is chosen whenever the analog input signal $V_{in}$ 206 is less than three-fourths of the maximum analog input voltage range of 2.4 volts, or 1.8 volts for the A/D 200 as shown in FIG. 2. Since the P-channel comparator U37 is better at handling low input analog signals, and the N-channel comparator U36 is better at handling high input analog signals, the comparison structure of the A/D 200 is such that the correct one of the comparators U36, U37 is chosen based on the level of the analog input signal $V_{in}$ 206.

Different switching arrangements can be employed by one of ordinary skill in the art while still keeping within the teachings of the invention for having two or more comparators that each receive an analog input signal $V_{in}$ 206. This allows for a wider dynamic range than what can be achieved using only one comparator. For example, if the A/D 200 is designed to handle an input range of from 0 to 3.6 volts, then $a_7$ can be fed directly into the control input of the off/on nswitch U39 and the on/off switch U40. This direct connection is possible because $a_7$, being set equal to "one" after the MSB comparison, would mean that $V_{in}$ 206 is greater than 3.6/2=1.8 volts, and therefore U37 should be utilized for the next seven conversion cycles. If $a_7$ is set equal to "zero" after the MSB comparison, this would mean that $V_{in}$ 206 is less than 1.8 volts, and so U36 should be utilized for the next seven conversion cycles of the eight-bit read.

This comparison structure, which in the preferred embodiment includes two comparators U36, U37, appropriate switching circuitry U39, U40, and appropriate control of the switching circuitry by U38, $a_7$, and $a_6$, allows for a greater range of analog input signals $V_{in}$ 206 than that used in conventional successive approximation A/Ds.

The inverter U25 receives the output from the switching circuitry U39, U40, and the inverter U26 receives the output from the inverter U25 and places the signal back to its correct polarity. Inverters U25 and U26 are utilized to add some gain to the output comparison signal 222 and also to output a signal 224 representative of the output comparison signal 222, but with more well-defined rising and falling edges, so that the well-defined, high gain signal 224 can then be sent to the flip-flops U1 through U8.

Flip-flops U1 through U8 receive the well-defined output comparison signal 224, and a respective one of these flip-flops is enabled by a Ring Counter 223 comprising flip-flops U9 through U16, in order to latch (on its Q output) a digital bit corresponding to the bit being compared by the A/D 200. The respective one of the flip-flops U1 through U8 also outputs a digital bit (on its Q-bar, or inverted Q output) to Gate Circuits U17 through U24 to control the enabling of the eight-bit digital input $a_7a_6a_5a_4a_3a_2a_1a_0$ 212 to the D/A 210. In FIG. 3, flip-flops U4, U5 and U6 are not shown. Flip-flops U4, U5 and U6 have connections similar to the connections of flip-flops U2, U3, U7 and U8. That is, each of the flip-flops U4, U5 and U6 has a Q-bar output connected to a respective gate circuit U20 through U22 (also not shown in FIG. 3), and each of the flip-flops U4, U5 and U6 has a clock input CLK that receives a Q-bar output from a respective flip-flop U12 through U14 of ring counter 223 (also not shown in FIG. 3).

The ring counter 223, which comprises flip-flops U9 through U16, controls the eight-bit comparison cycle, and is also used to enable the appropriate one of the flip-flops U1 through U8 to output the comparison result 224 performed by the chosen one of the comparators U36, U37. The output from the chosen one of the comparators U36, U37 is then clocked through the appropriate one of the flip-flops U1 through U8 to the serial data bus 290 via multiplexer U32. At the rising edge of a gated input clock GCLK 258, the flip-flops U9 through U16 of the ring counter 223 incrementally enable each respective bit of D/A U35. The bit is held enabled to the D/A U35 if and only if a logic "one" is output from the comparators U36, U37 to the flip-flops U1 through U8 of the latch circuit 221, indicating that the analog input signal $V_{in}$ 206 is greater than the D/A U35 analog output 208. This process continues from the MSB to the LSB, to provide an eight-bit digital word representative of the analog input voltage $V_{in}$ 206.

The A/D conversion formula is determined by the equation:

$$\text{Count}=(V_{in}/(2*V_{ref}))*2^n,$$

where n is the number of bits of the A/D 200. In the invention according to the preferred embodiment, n equals 8, and $V_{ref}$ equals 1.2 volts, but n can be any integer value and $V_{ref}$ can be higher or lower to increase or decrease the resolution of the converter as one of ordinary skill in the art will realize.

Gates U33, U29, U30, U31 and flip-flop U27 provide the logic to control the start of the conversion cycle and to provide a Clear Signal 275 to the flip-flops U1 through U7 of the latch circuit 221 and the flip-flops U9 through U16 of the ring counter 223 in order to perform successive reads. U32 is a multiplexer which converts the latched comparison states into serial data to be output onto the serial data bus 290.

NAND/AND Gate U33 receives the ungated clock signal CLK 280 on one of its two input ports, and the Register Select signal RS-H 282 on the other of its two input ports. Gate U33 has a NAND output for outputting a gated, inverted clock signal GCLK_286, which is used to clock flip-flop U27, and Gate U33 has an AND output for outputting the gated clock signal GCLK 258, which is used to clock all of the other components of the A/D 200 which have clock inputs. By this configuration, flip-flop U27 becomes clocked on the falling edge of the ungated clock signal CLK 280, and the rest of the flip-flops U1 through U16 become clocked on the rising edge of the CLK 280. Thus, U27 gets clocked one-half clock cycle in time with respect to the other flip-flops U1 through U16 of the A/D 200.

The Register Select signal RS-H 282 is used to select the A/D 200. When the Register Select signal RS-H 282 is low, Gate U33 outputs a "zero" on its AND output, and thereby does not enable the clocking of any of the components U1 through U16, which results in no data being output from the A/D 200. When RS-H 282 is high, the Gated Clock signal GCLK 258 is output on the AND output of U33, thereby enabling the clocking of flip-flops U1 through U16, and resulting in data being clocked out of the A/D 200. The Gated Inverted Clock signal GCLK_286 is also output on the NAND output of U33, thereby enabling the clocking of flip-flop U27, which is a negative-edge triggered flip-flop with respect to the input Clock signal CLK 280.

In the preferred embodiment, the clock signal has a period of 2 microseconds, which allows enough time for the D/A U35 to perform its conversion and for the output of the D/A U35 to make its way back to the input 212 of the D/A U35 within one clock cycle. Any other reasonable clock frequency for CLK 280 may be chosen for the invention as described herein. The only clock frequency selection criteria is that the clock frequency cannot be so fast that it does not allow for the data to be output from the D/A U35, be compared by the comparators U36, U37, be latched by the flip-flops U1 through U8, and be gated by the gates U17 through U24 back to the input of D/A U35 before the next clock cycle occurs.

The Chip Select CS-H 248 is input directly to the Clear input of U27, and is an active high signal in the embodiment shown. CS-H 248 also is fed to an input port of AND Gate U30. The other input port of U30 receives the output signal from NAND Gate U29. U29 has a first input port that receives the Q-bar output from flip-flop U9 of ring counter 223, and has a second input port that receives the Q output from U27. Since U27 is clocked by GCLK_286, and since U9 is clocked by GCLK 258, U29 outputs a "zero" at a time corresponding to one-half clock cycle for every eight-bit digital conversion. When CS-H 248 is asserted (i.e., is in a "High" state), this signal passes through U30 as a one-half clock cycle reset signal 275.

Gated Clock signal GCLK 258 and Inverted Gated Clock signal GCLK_286 are respectively output from the AND and the NAND output ports of U33. Before the first conversion (i.e., before the Register select signal RS-H 282 is enabled), when CS-H 280 is first enabled, Flip-flops U9 through U16 of the ring counter 223 will all have a "zero" at their respective Q outputs, and "one" at their respective Q-bar outputs. At the next clock cycle, if the chip select signal CS-H 248 is still enabled, Flip-Flop U9 of the ring counter 223 will have a "one" at its Q output and a "zero" at its Q-bar output, since its D input is directly connected to the Q-bar output of U16, which was set to "one" during the previous clock cycle when CS -H 248 was first enabled.

When RS-H 282 is enabled (and stays enabled during the entire conversion process), the "one" on the Q-bar output of U9 is clocked through to the Q-output of U10, since the Q-bar output of U9 is directly connected to the D-input of U10. Six clock cycles later, that "one" will propagate successively through flip-flops U11, U12, U13, U14, and U15 of the ring counter 223, to the Q-output of U16. When the "one" is clocked through to the Q-output of U16, the Q output of U16 will switch from a "zero" to a "one", and the Q-bar output will switch from a "one" to a "zero" for exactly one clock cycle. The "zero" on Q-bar of U16 is sent directly to the D-input of U9, and on the next clock cycle, a "zero" is output on the Q-output of U9. The Q-output of U9 is directly tied to the D-input of U27, which clocks in the "zero" at one-half clock cycle later, since U27 is clocked by GCLK 286, not GCLK 258. The Q-output from U27 is sent to one input port of NAND gate U29, and the Q-bar output of U9 is sent to the other input port of NAND gate U29. This results in a half-clock cycle reset signal 275 being output from U30 at the start of the MSB comparison of every eight-bit read cycle. That is, U30 outputs a "zero" for a one-half clock cycle at the MSB comparison of every eight-bit conversion cycle.

That "zero" acts to clear flip-flops U1 through U7 and U9 through U16. Flip-flop U8 is not cleared at this time, since it is holding data for the LSB, which has not yet been sent over the serial data bus 290. Flip-flop U8 receives a staggered clear signal 296 from the Q-bar output of U10, which means that U8 will be cleared during the $a_6$-bit comparison of the next eight-bit A/D conversion; i.e., the next 8-bit read.

When U30 outputs a "zero", every flip-flop in the A/D 200 gets reset except for U8. Then, on the next cycle of the clock, a "zero" propagates from the D-input of U27 to the Q-output of U27, and so a "one" appears at one input of U29, which forces its output back to a "one" thereby pulling out of the reset after one-half clock cycle (the output of U29 goes back to a "one" again). When the one-half clock cycle reset signal 275 is asserted, it acts to clear U9, but by clearing U9, it maintains the Q-bar output of U9 at a "one". This acts to keep the one-half clock cycle reset signal 275 asserted until the next positive-to-negative edge of the clock signal. At that time, U27 will then finally propagate a "zero" through from its D-input to its Q-output, forcing one of the two inputs of U29 to a "zero", and thereby ending the reset 275 one-half clock cycle after it was asserted.

Therefore, at the start of every MSB comparison, there occurs a one-half clock cycle reset for every flip-flop except the one for the LSB, namely U8. The MSB comparison, as well as the comparison for the other n-1 bits, always starts on a rising edge of the clock signal, since the flip-flops used in these comparisons are clocked by the gated clock signal GCLK 258 output from U33.

Since the A/D 200 according to the invention operates such that only one address cycle is required for multiple reads, it is necessary to have the LSB flip-flop U8 be cleared at a later time than the other flip-flops U1 through U7 of the A/D 200. Otherwise, the LSB data will be cleared and lost before it is latched onto the output bus. Whenever a particular bit is being compared in the invention as described herein, such as $a_6$ for example, the previous bit $a_7$ that was compared is being read out on the data bus 290. Therefore, a problem exists in the turnover between the $a_0$ bit of one eight-bit comparison cycle and the $a_7$ bit of the next eight-bit conversion cycle. When the $a_7$ bit is being compared, the $a_0$ bit for the previous conversion cycle is being read out onto the data bus 290. Therefore, a staggered clear or reset system is required, in which the flip-flop U8, which outputs bit $a_0$ onto the serial data bus 290, receives a staggered clear signal 296 at a later point in time than the other flip-flops U1 through U7 of the A/D 200.

Flip-flops U1 through U8 hold data that corresponds respectively to bits $a_7a_6a_5a_4a_3a_2a_1a_0$. Each flip-flop receives a comparison signal 224, and each of the flip-flops U1 through U8 is respectively clocked by a flip-flop U9 through U16 of the ring counter 223. As an example, when the $a_7$ compare is being performed, either a "zero" or a "one" is output to each of the flip-flops U1 through U8, depending upon whether $V_{in}$ 206 is less than or greater than the analog output of the D/A U35 corresponding to a digital input equal to 10000000. At the next clock cycle, U9 outputs a "one" on its Q output, which is sent to the Clock input (CLK) of U1. Note that all of the other flip-flops U2 through U8 of the latch circuit 221 are not clocked by their respective ring counter flip-flops U10 through U16. Thus, U1 outputs the comparison value 224 from its D input onto its Q output at the next clock cycle, which is sent to the serial data bus 290 via multiplexer U32.

At that next clock cycle in which U1 is outputting the $a_7$ comparison value onto the serial data bus 290, the $a_6$ comparison is being performed by the A/D 200. This process continues down to bit $a_0$. When bit $a_0$ is being read out onto the serial data bus 290, bit $a_7$ of the next eight-bit comparison is being performed by the A/D 200. Therefore, when the A/D 200 is being cleared to properly perform the next eight-bit conversion, the LSB of the previous eight-bit conversion should not be cleared at that same time, in order for the comparison corresponding to bit $a_0$ to be sent out on the serial data bus 290. In the preferred embodiment, flip-flop U8 is cleared (on its CLR_input) during the $a_6$ compare, since it receives the Q-bar output of flip-flop U10 of the ring counter 223, which changes from a high state to a low state during the $a_6$ comparison only, thereby supplying the staggered clear signal 296 to U8.

NAND Gates U17 through U24 and U31 are used to latch in the correct digital value from the previous compare into the respective input $a_7$–$a_0$ of the D/A U35. Each of NAND gates U18 through U24 receives the Q-bar output from a respective one of the flip-flops U10 through U16 of the ring counter 223, and each of the NAND gates U18 through U24 receives the Q-bar output from a respective one of the flip-flops U2 through U8 of the latch circuit 221. NAND gate U17 receives the Q output from U9, and the Q-bar output from flip-flop U1.

NAND gate U17 receives the Q-output from its respective ring counter flip-flop U9 in order to set up the digital input $a_7 a_6 a_5 a_4 a_3 a_2 a_1 a_0$ 212 to the D/A U35 to "10000000" before the start of the MSB comparison. That way, that the D/A U35 will output a value corresponding to one-half the allowable analog range to the inverting input of comparators U36 and U37. Since U17 receives the Q-bar output from flip-flop U1 of the latch circuit 221 and the Q-output from flip-flop U9 of the ring counter 223, when the chip select signal CS-H 248 is disabled prior to start of an eight-bit conversion cycle, U17 will have a "10" at its two input ports, and the other NAND gates U18 through U24 will have a "11" at their respective input ports, resulting in a bit equal to "one" for the MSB and "zero" for all of the other bits at the input 212 to the D/A U35 (i.e., 10000000).

After the MSB compare, U17 will either keep the MSB at a "one", or switch it to a "zero", based on the comparison signal output from latch U1's Q-bar output. That is, if the $a_7$ comparison resulted in a "one" being output from inverter U26 of the comparison circuit, that "one" will be clocked through from the D input of U1 to the Q output of U1 at the next clock cycle, along with a "zero" being clocked through to the Q-bar output of U1 at that same next clock cycle. The "zero" from the Q-bar output of U1 appears at one input port of U17, along with a "one" from the Q output of U9, since the "one" in the ring counter 223 has now cycled to the next flip-flop U10 of the ring counter 223. Therefore, a "01" at the input of U17 will result in a "1" that will stay at the MSB $a_7$ of D/A U35 for the entire eight-bit conversion.

If the $a_7$ comparison resulted in a "zero" being output from the inverter U26 of the comparison circuit, that "zero" will be clocked through to the Q output of u1 at the next clock cycle, along with a "one" being clocked through to the Q-bar output of U1 at that same next clock cycle. The "one" from the Q-bar output of U1 appears at one input port of U17, along with a "one" from the Q output of U9, as explained previously. Therefore, a "11" at the input of U17 will result in a "0" that will stay at the MSB $a_7$ of D/A U35 for the entire eight-bit conversion. Since the D-input of U9 will receive only "one"s from the Q-bar output of U16 for next seven comparisons of the eight-bit read, and since U1 will not receive any more rising edges from the Q output of U9, it cannot latch in any more comparison data 244 at its D input after the MSB comparison. Thus, $a_7$ will not change its value after the MSB comparison has been performed, and will stay the same for the last seven comparisons of the eight-bit conversion.

AND gate U31 is required to ensure the proper operation of the A/D 200 during an LSB conversion from one eight-bit conversion and an MSB conversion from the next eight-bit conversion. As stated earlier, flip-flop U8 is not cleared immediately at the start of a new eight-bit comparison, unlike the other flip-flops that make up the A/D 200. Therefore, since U8 might contain a "zero" at its Q-bar output signifying that the LSB should be set to a "one", that value can be output to the serial data bus 290, but it cannot be sent to its respective input port $a_0$ of the D/A U35 until after U8 has been cleared by the staggered clear signal 296. AND gate U31 ensures that a "one" output from U24, which is received at one input port of U31, will not appear at the LSB input $a_0$ of the D/A U35 during the MSB comparison. This is true since the other input port of U31 receives the Q output of flip-flop U9 of the ring counter 223, which is set to a "zero" value during the clock cycle corresponding to the MSB comparison, and is set to a "one" value at all other times.

U31 provides a good MSB (i.e., $a_7$) comparison when the A/D 200 is rolling over into the next read of an analog input signal to be converted into an eight-bit digital word. Because the A/D 200 places the LSB bit ($a_0$) onto the data bus for a previous eight-bit read at the same time it is doing an MSB bit compare for a current eight-bit read, there is needed a way to preserve the state of the LSB of the previous read when the A/D 200 is being cleared by the half-cycle reset signal 275 to set up the A/D 200 for the MSB comparison for the new eight-bit read.

Since flip-flop U8 does not receive the half-clock cycle reset signal 275, the output of U8 is sent to the multiplexer U32, to be sent out onto the serial data bus 290. Meanwhile, every other component of the A/D 200 gets set up (by being reset by-the one-half clock cycle reset 275) to do the MSB compare for the next read, while the LSB from the previous read is sent out onto the data bus 290. This feature is provided by the staggered reset signal 296 being sent only to flip-flop U8 and only just before the start of the bit $a_6$ comparison. U31 ensures that when the bit $a_7$ comparison is being performed, a "zero" is being output from U31 to the D/A U35 so that the MSB will be compared to the one-half maximum analog value output from the D/A U35, even though U8 is still holding the data from the LSB of the last 8-bit conversion, which could be either a zero or a one. U31 allows the A/D 200 to place the LSB data onto the data bus 290, at the same time an MSB compare is being performed for the next read cycle, thereby not requiring resetting of flip-flop U8 when the MSB is being compared.

Figure 4:
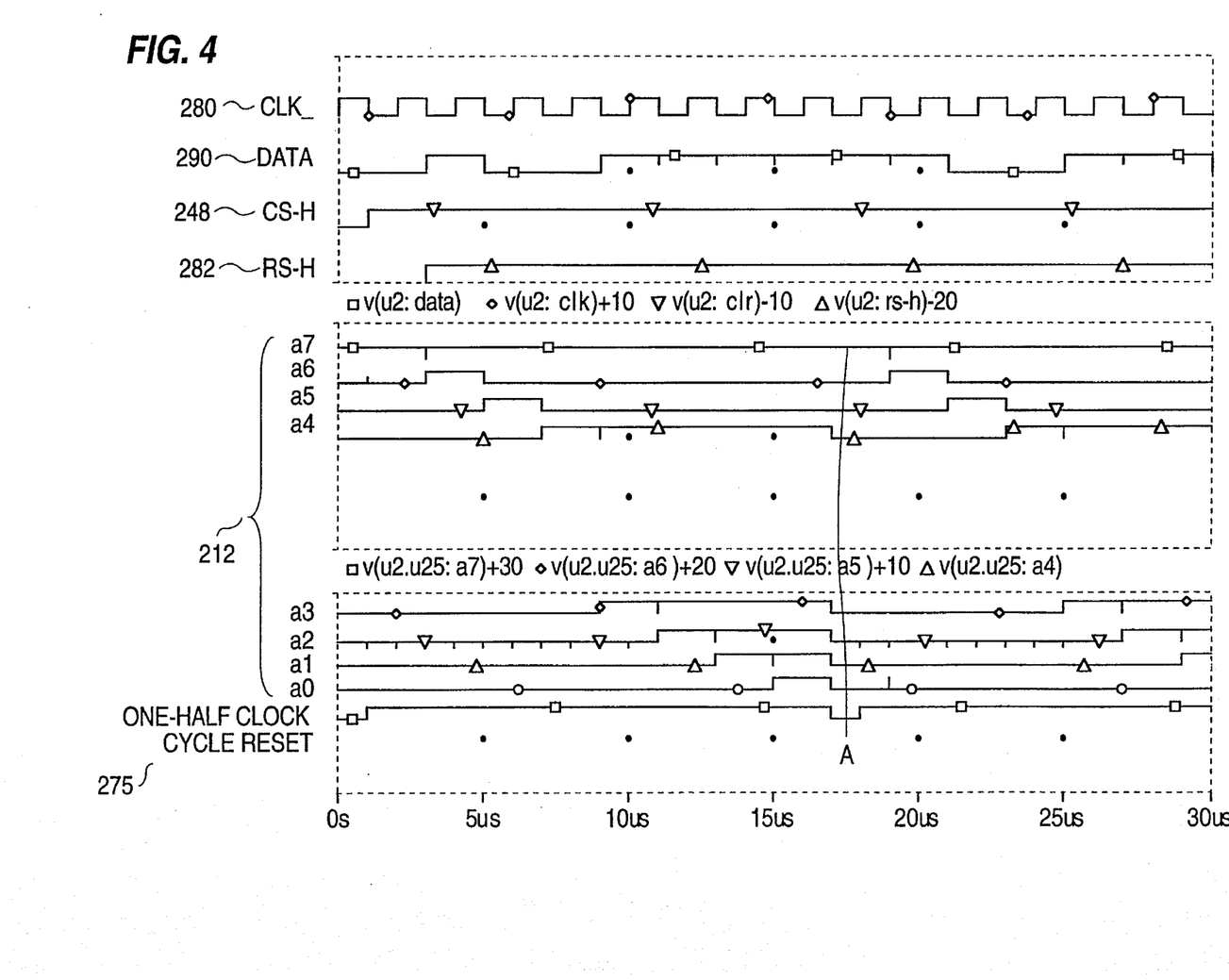
FIG. 4 shows timing diagrams of the digital-to-analog converter control during the conversion cycles, according to the preferred embodiment of the invention.

FIG. 4 shows timing diagrams corresponding to inputs to the D/A U35 of the A/D 200, for $V_{in}$ 206 equal to 1.5 volts, according to the preferred embodiment. Trace 290 shows a serial output of 10011111, that repeats every eight clock cycles without any unnecessary delay. This repeated read capability allows for multiple conversions of the same signal (in this case, the 1.5 volt input signal) using only eight bits of bus activity per conversion.

At the end of each A/D conversion, the input ports 212 of D/A U35 are reset to 10000000 by the one-half clock cycle reset signal 275 in order to start the comparison process for the next eight-bit conversion cycle, as can be seen at point A of traces 212 of FIG. 4. Note that bit $a_7$ is left enabled when the A/D 200 is in the Deselected state (CS-H 248 set to a Low value), which allows bit $a_7$ to be latched at the start of the conversion during the rising edge of the next clock cycle after the CS-H 248 has been enabled, and allows for reading of the data on the output data bus at the next rising edge of the clock CLK 280.

Figure 5:
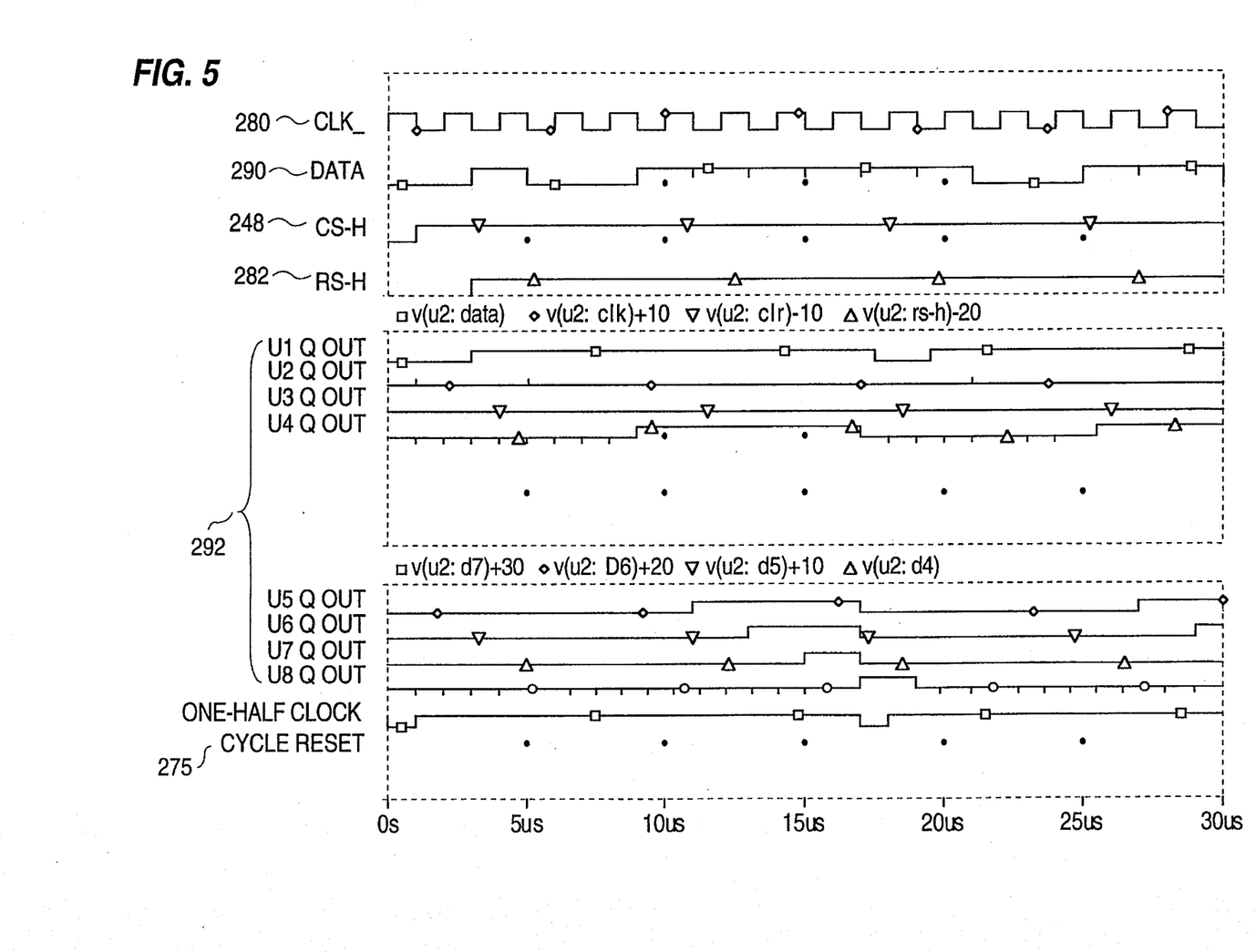
FIG. 5 shows timing diagrams of the parallel output registers according to the preferred embodiment of the invention.

FIG. 5 shows the output of the parallel output flip-flops U1 through U8 for the 1.5 volt input $V_{in}$. The flip-flops U1 through U8 are used to latch the result of the bit being compared. Therefore, when bit $a_7$ is compared and the result is one (wherein $V_{in}$ is greater than the D/A U35 output corresponding to 10000000), a "one" is output from the comparators U36, U37 through the inverters U25, U26 to the D-input of flip-flops U1 through U8. The "one" is latched into the output of U1 at the next clock cycle, and thereby sent to the serial data bus 290 via the $a_7$ input of multiplexer U32. Alternatively, when bit $a_7$ is compared and the result is zero, a "zero" is latched onto the Q-output of U1 at the next clock cycle.

Thus, when the A/D 200 is making the MSB comparison, the LSB from the last read is enabled onto the output data buses 290. As an example, when the A/D 200 is making a comparison for the $a_6$ bit, the $a_7$ bit will be output onto the data bus 290. At the time the A/D 200 switches from comparing the $a_7$ bit to comparing the $a_6$ bit, the bit $a_7$ will be latched into the Q-output of U1 as soon as the comparison is started on bit $a_6$. At this same time, as soon as the comparison is begun on bit $a_6$, the multiplexer U32 takes bit $a_7$ and outputs it onto the data bus 290. Thus, at the start of each read cycle, bit $a_0$ from the previous read cycle is being output onto the data bus 290.

This feature allows for consecutive reads, thereby enabling the A/D 200 to perform a conversion cycle on every rising edge of the input clock signal. Essentially, consecutive reads can be performed using the A/D 200 according to the invention without having to apply an external reset signal to the A/D 200.

When bit $a_0$ is latched onto the serial data bus 290, the half-clock cycle reset signal 275 output from U30 is asserted on all of the flip flops except U8, which must be held to allow the data bus to complete the eight-bit read. Flip-flops U1 through U7 are set to zero when the CS-H signal 248 is set to a low value, but flip-flop U8 is not reset at that time. LSB input $a_0$ to the D/A U35 is reset to zero for the MSB comparison of the next read by disabling LSB input $a_0$ to the D/A U35 whenever the MSB is set up for comparison, using Gate U31 as described earlier.

Figure 6:
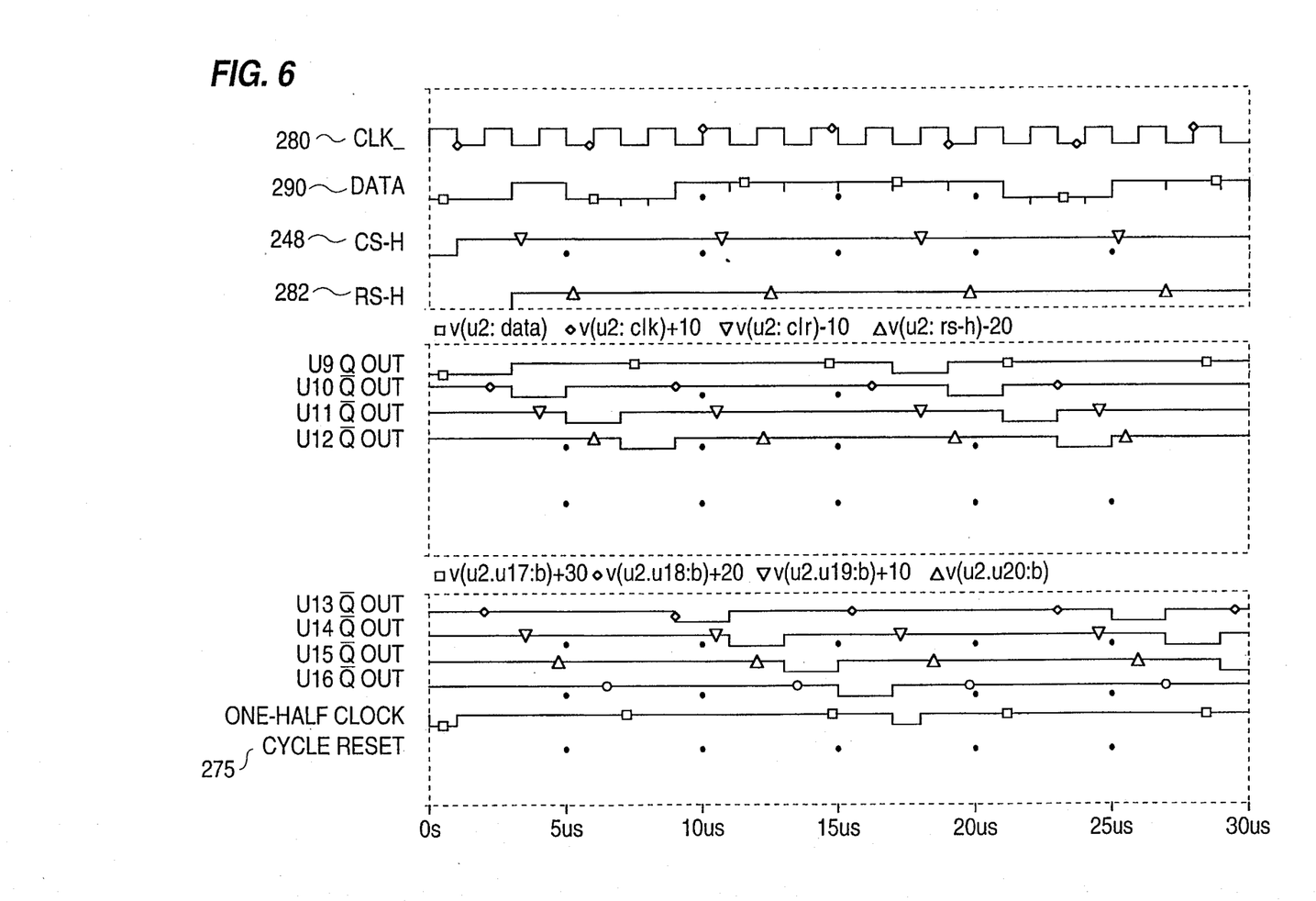
FIG. 6 shows timing diagrams of the outputs of the ring counter according to the preferred embodiment of the invention.

FIG. 6 shows the output signal timing relationships of the flip-flops U9 through U17 which comprise the ring counter 223. The ring counter 223 successively enables each bit of the D/A U35 to set up the next bit of comparison. Gates U17 through U24 ensure that each bit of the D/A U35 is asserted during the low state of each bit of the ring counter 223. That bit is either held enabled by the flip-flops U1 through U8 for that bit or returned to a low state if $V_{in}$ 206 is less than the D/A analog output 208 for that particular comparison.

Figure 7:
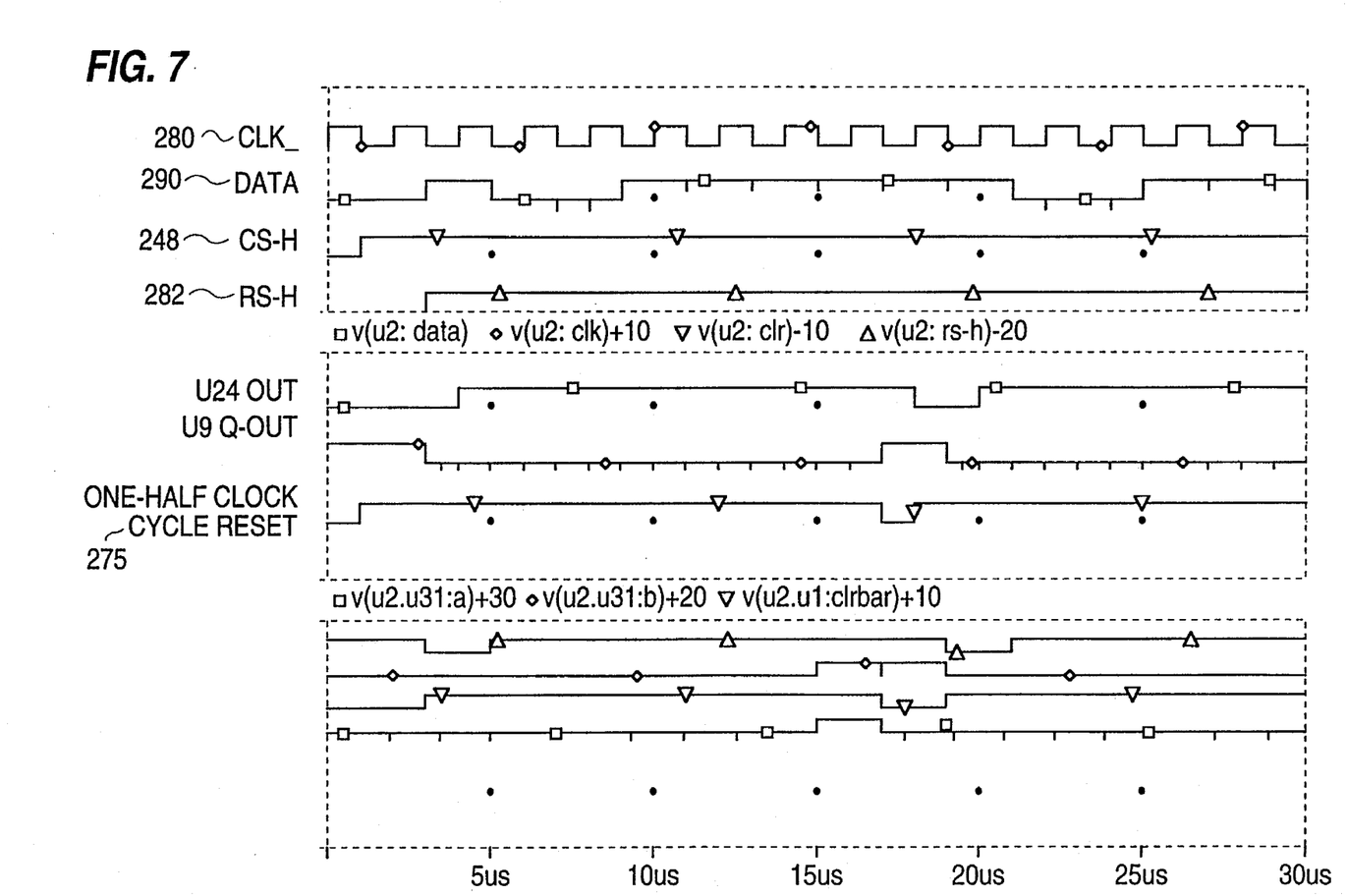
FIG. 7 shows timing diagrams of the reset and clear logic according to the preferred embodiment of the invention.

FIG. 7 shows the timing of the reset, or clear logic of the A/D 200. The one-half clock cycle reset signal 275 is asserted (i.e., placed into a Low state) for one-half cycle from the time the MSB comparison begins. As described earlier, the one-half clock cycle reset signal 275 is generated using an "AND" (U29) of a positively edge-triggered flip-flop (U9) and a negatively edge-triggered flip-flop (U27).

While preferred embodiments of the invention have been described, modifications of the described embodiments may become apparent to those of ordinary skill in the art, following the teachings of the invention, without departing from the scope of the invention as set forth in the appended claims.

What is claimed is:

1. A successive approximation A/D converter for receiving an analog input signal and outputting an n-bit digital signal, comprising:

means for receiving said analog input signal;

a digital-to-analog converter, said digital-to-analog converter including n input ports for receiving an n-bit digital word, and an output port for outputting an analog potential signal based on said n-bit digital word, wherein n is an integer greater than one and wherein bit n corresponds to a most significant bit and bit 0 corresponds to a least significant bit;

means for comparing said analog input signal to said analog potential signal and outputting a comparison result for each bit of said n-bit digital word;

means for outputting a one-half clock cycle reset signal at a clock cycle immediately before start of a comparison of said most significant bit for an n-bit conversion;

means for outputting a delayed reset signal at a clock cycle after said one-half clock cycle reset signal is output;

an n-bit counter that outputs a count signal indicative of which bit of said n-bit digital word is currently being compared by said comparing means;

n latches each receiving said comparison result from said comparing means at an input port and said count signal from said n-bit counter at an enable port and outputting said comparison result at an output port on a next clock cycle, said n latches respectively corresponding to said n bits of said n-bit digital word, wherein a first n−1 of said n latches respectively corresponding to bit n through bit 1, receive said one-half clock cycle reset signal at a clear input, and a remaining one of said n latches respectively corresponding to bit 0, receives said delayed reset signal at a clear input, and wherein one of said n latches outputs said comparison result onto an output data bus based on said count signal; and n gates respectively connected to said output port of said n latches and each receiving said count signal from said counter, said n gates outputting an n-bit gated signal to said n input ports of said digital-to-analog converter based on a logical result of said count signal and said comparison result.

2. A successive approximation A/D converter as recited in claim 1, wherein said comparing means comprises:

an N-channel comparator coupled to said input means on a first input port and coupled to receive said analog potential signal on a second input port, and outputting a first comparison result on an output port;

a P-channel comparator coupled to said input means on a first input port and coupled to receive said analog potential signal on a second input port, and outputting a second comparison result on an output port;

a NAND gate having a first input port connected to said n-th input port of the digital-to-analog converter and a second input port connected to the n−1th input port of said digital-to-analog converter, and outputting a gated result on an output port;

a switch having a control input port coupled to said output port of said NAND gate and having an input port coupled to said output port of said P-channel comparator; and a Not-switch having a control input port coupled to said output port of said NAND gate and having an input port coupled to said output port of said N-channel comparator, wherein when said n-th input port and said n−1th input port of said digital-to-analog converter both are at a high state, said switch allows said output of said P-channel comparator through to said n latches, and said not-switch does not allow said output of said N-channel comparator through to said n latches, and wherein said n-th input port and said n−1th input port are at any other state, said switch does not allow said output of said P-channel comparator through to said n latches, and said not-switch allows said output of said N-channel comparator through to said n latches.

3. A successive approximation A/D converter as recited in claim 1, wherein said comparing means further comprises:

a first inverter having an input port connected to said output of said not-switch and said switch, and having an output port for outputting an inverted signal; and a second inverter having an input port connected to said output port of said first inverter and having an output port connected to each of said input ports of said n latches, said second inverter receiving said inverted signal and outputting an amplified signal; wherein said first and second inverters add amplification and signal shaping to said signals output from said switch and not-switch.

4. A successive approximation A/D converter as recited in claim 1, wherein said n-bit counter is a ring counter.

5. A successive approximation A/D converter as recited in claim 1, wherein said delayed reset signal is output at a clock cycle immediately after a clock cycle in which said one-half clock cycle reset signal is output.

6. A successive approximation A/D converter as recited in claim 1, wherein said means for outputting a one-half clock cycle reset signal comprises:

a flip-flop clocked by a falling edge of a clock signal, having a input port receiving said count signal indicative of said least significant bit being compared by said comparing means, and having an output port; and a gate having a first input port connected to said output port of said flip-flop and having a second input port connected to said count signal of said counter, wherein said one-half clock cycle reset signal is output by said gate when said count signal indicates that said most significant bit is being compared by said comparing means.

7. A successive approximation A/D converter as recited in claim 4, further comprising:

an n+1th gate having a first input connected to an output of a corresponding one of said output ports of said n gates that is connected to said remaining one of said n latches, and said n−1th gate having a second input connected to said n-bit counter, wherein when said counter indicates that a bit n−1 comparison is currently being performed, said n+1th gate outputs from said corresponding one of said n latches to said input port of said digital-to-analog converter corresponding to said least significant bit, and wherein said n+1th gate outputs a logical zero state otherwise.

8. A successive approximation A/D converter as recited in claim 7, wherein said ring counter comprises n D-type flip-flops, each having a D input and a Q and Q-bar output, and a first of said n D-type flip-flops having its Q-bar output connected to a D-input of a second of said D-type flip-flops;

an i-th of said n D-type flip-flops having its respective Q-output connected to a D-input of an i−1th of said n D-type flip-flops, where i is an integer between 3 and n, and said n-th of said n D-type flip-flops having its Q-bar output connected to a D-input of said first of said n D-type flip-flops.

9. A successive approximation A/D converter as recited in claim 8, wherein a Q-bar output of said first of said n D-type flip-flops is output to said second input of said n−1th gate.

10. A successive approximation A/D converter as recited in claim 1, wherein said n latches are D-type flip-flops, and wherein each of said D-type flip-flops have an output port connected to one line of an n-bit parallel output bus.

11. A successive approximation A/D converter as recited in claim 1, further comprising:

a multiplexer having n input ports respectively connected to said n latches, having n address ports respectively connected to said n-bit counter, and having an output port for outputting data onto a serial bus, and wherein said ith address port is enabled to allow said ith input port onto said serial data bus when said i−1th bit is being compared by said A/D converter.

12. A comparison circuit for a successive approximation A/D converter, said A/D converter including a D/A converter having n input ports for receiving an n-bit digital word and an output port for outputting an analog result, an input port for receiving an analog input signal to be converted to a digital signal, and a successive approximation circuit for applying an n-bit input to said n input ports of said D/A converter based on a result received from said comparison circuit, said comparison circuit comprising:

an N-channel comparator coupled to said input port on a first input port and coupled to said output port of said D/A converter on a second input port, and outputting a first comparison result on an output port;

a P-channel comparator coupled to said input port on a first input port and coupled to said output port output of said D/A converter on a second input port, and outputting a second comparison result on an output port;

a NAND gate having a first input port connected to the n-th input port of the D/A converter and a second input port connected to the n−1th input port of the D/A converter, and outputting a gated result on an output port;

a switch having a control input port coupled to said output port of said NAND gate and having an input port coupled to said output port of said P-channel comparator; and a Not-switch having a control input port coupled to said output port of said NAND gate and having an input port coupled to said output port of said N-channel comparator, wherein when said n-th input port and said n−1th input port of said D/A converter both are at a high state, said switch allows said output of said P-channel comparator through to successive approximation circuit, and said not-switch does not allow said output of said N-channel comparator through to said successive approximation circuit, and wherein said n-th input port and said n−1th input port are at any other state, said switch does not allow said output of said P-channel comparator through to said successive approximation circuit, and said not-switch does allow said output of said N-channel comparator through to said successive approximation circuit.

13. A comparison circuit as recited in claim 12, further comprising:

a first inverter having an input port connected to said output of said not-switch and said switch, and having an output port for outputting an inverted signal; and a second inverter having an input port connected to said output port of said first inverter and having an output port connected to said successive approximation circuit, said second inverter receiving said inverted signal and outputting an amplified signal; wherein said first and second inverters add amplification and signal shaping to said signals output from said switch and not-switch.

14. An N-bit successive approximation register, comprising:
- an N-bit latch including N latch circuits connected together, each of said N latch circuits having a clock input, a clear input and a data input for receiving a signal indicative of whether a prior successive approximation number is too high or too low;
- N gates each having a first input coupled to an output of a respective latch circuit, a second input, and an output for producing a bit of an N-bit successive approximation number;
- an N-bit shift register including N shift registers connected together to form a ring counter, each of said N shift registers having a clock input, a clear input, a first output and a second output which outputs a complementary signal with respect to said first output, a first of said N shift registers having said respective first output coupled to a respective one of said N gates, and the remaining N−1 of said N shift registers having said respective second output coupled to a respective one of said N gates; and
- means for outputting a clear signal in phase with a rising edge of a clock signal, and a delayed clear signal in phase with a falling edge of said clock signal;
- wherein a respective one of said N latch circuits corresponding to a least significant bit of said N-bit successive approximation number receives said delayed clear signal when each of said other N latch circuits and each of said N shift registers receives said clear signal, thereby allowing said least significant bit to be read onto an output bus when a comparison is being performed on a most significant bit for another digital conversion.

15. An N-bit successive approximation register as recited in claim 14, wherein said N-bit latch comprises N D-type flip-flops.

* * * * *